(12) United States Patent
Nash et al.

(10) Patent No.: US 9,379,675 B2
(45) Date of Patent: Jun. 28, 2016

(54) POWER DETECTOR WITH OVERDRIVE DETECTION

(71) Applicant: ANALOG DEVICES GLOBAL, Hamilton (BM)

(72) Inventors: Eamon Nash, Chicago, IL (US); Mingming Zhao, Beijing (CN); Ovidiu Vasile Balaj, Kirkland (CA); Peadar Antony Forbes, Cloghroe (IE); Claire Masterson, Dublin (IE)

(73) Assignee: Analog Devices Global, Hamilton (BM)

( * ) Notice: Subject to any disclaimer, the term of this patent is extended or adjusted under 35 U.S.C. 154(b) by 113 days.

(21) Appl. No.: 14/282,484

(22) Filed: May 20, 2014

(65) Prior Publication Data

US 2015/0236658 A1 Aug. 20, 2015

Related U.S. Application Data

(60) Provisional application No. 61/942,422, filed on Feb. 20, 2014.

(51) Int. Cl.
*H03F 1/52* (2006.01)
*H03F 1/02* (2006.01)
*H03F 3/195* (2006.01)
(Continued)

(52) U.S. Cl.
CPC ............. *H03F 1/52* (2013.01); *H03F 1/0222* (2013.01); *H03F 1/0266* (2013.01); *H03F 3/195* (2013.01); *H03F 3/24* (2013.01); *H03F 3/72* (2013.01); *H03F 2200/102* (2013.01); *H03F 2200/18* (2013.01); *H03F 2200/192* (2013.01); *H03F 2200/195* (2013.01); *H03F 2200/426* (2013.01); *H03F 2200/435* (2013.01);
(Continued)

(58) Field of Classification Search
CPC ........................................................ H03F 1/52
USPC ..................... 330/298, 207 P, 51, 129, 136
See application file for complete search history.

(56) References Cited

U.S. PATENT DOCUMENTS 3,696,369 A * 10/1972 Laymon ............. G08B 13/1663
367/136
6,188,277 B1 2/2001 Borodulin et al.
(Continued)

OTHER PUBLICATIONS

Hittite Microwave Corporation, HMC1021LP4E, RMS Power Detector & Envelope Tracker, DC—3.9 GHz, Data Sheet, v02, May 2011. 24 pages. Available at: https://www.hittite.com/content/documents/data_sheet/hmc1021lp4.pdf (accessed Jun. 3, 2014).

(Continued)

*Primary Examiner* — Henry Choe
(74) *Attorney, Agent, or Firm* — Knobbe Martens Olson & Bear LLP

(57) ABSTRACT

Aspects of this disclosure relate to protecting a circuit, such as an amplifier, from transient overdrive events and/or average overdrive events. In one embodiment, an indication of average power, such as root mean squared (RMS) power of a radio frequency (RF) signal, can be compared to a first threshold and an indication of a peak RF power can be compared to a second threshold. When the indication of average power exceeds the first threshold, an average overdrive event can be detected. When the indication of peak power exceeds the second threshold, a peak overdrive event can be detected. If either a transient overdrive event or an average overdrive event is detected, a circuit, such as an amplifier, can be protected.

20 Claims, 5 Drawing Sheets

(51) Int. Cl.
*H03F 3/24* (2006.01)
*H03F 3/72* (2006.01)

(52) U.S. Cl.
CPC .. *H03F 2200/451* (2013.01); *H03F 2203/7215* (2013.01); *H03F 2203/7221* (2013.01)

(56) References Cited

U.S. PATENT DOCUMENTS

| | | | |
|---|---|---|---|
| 6,424,216 B2 | 7/2002 | Mu et al. | |
| 6,525,605 B2 | 2/2003 | Hu et al. | |
| 7,368,985 B2 * | 5/2008 | Kusunoki | H03F 1/02 330/10 |
| 7,659,707 B2 | 2/2010 | Eken et al. | |
| 7,986,186 B2 * | 7/2011 | Marbell | H03F 1/0222 330/136 |
| 7,994,855 B2 * | 8/2011 | Garg | H03G 3/001 330/124 R |
| 8,072,205 B1 | 12/2011 | Deo et al. | |
| 2011/0111711 A1 * | 5/2011 | Bo | H03F 1/0244 455/127.1 |

OTHER PUBLICATIONS

Analog Devices, ADL5511 Data Sheet, DC to 6 GHz Envelope and TruPwr RMS Detector ADL5511, Rev A, 2012, 28 pages. Available at: http://pdf1.alldatasheet.com/datasheet-pdf/view/455874/AD/ADL5511.html (accessed Jun. 3, 2014).

Analog Devices, ADL5511 Data Sheet, DC to 6 GHz Envelope and TruPwr RMS Detector ADL5511, Rev B, May 2014, 28 pages. Available at: http://www.analog.com/static/imported-files/data_sheets/ADL5511.pdf (accessed Jun. 3, 2014).

Analog Devices, ADL5502 Data Sheet, 450 MHz to 6000 MHz Crest Factor Detector, Rev A, Jan. 2011, 28 pages. Available at: http://www.analog.com/static/imported-files/data_sheets/ADL5502.pdf (accessed Jun. 3, 2014).

Linear Technology, LTC5564 Data Sheet, Ultrafast™ 7ns Response Time 5GHz RF Power Detector with Comparator, Rev B, Nov. 2013, 14 pages. Available at: http://cds.linear.com/docs/en/datasheet/5564fb.pdf (accessed Jun. 3, 2014).

Linear Technology, LTC5583 Data Sheet, Matched Dual-Channel 6GHz RMS Power Detector, Rev A, Dec. 2010, 28 pages. Available at: http://cds.linear.com/docs/en/datasheet/5583fa.pdf (accessed Jun. 3, 2014).

* cited by examiner

POWER DETECTOR WITH OVERDRIVE DETECTION

CROSS REFERENCE TO RELATED APPLICATION

This application is a non-provisional of and claims the benefit under 35 U.S.C. §119(e) of U.S. Provisional App. No. 61/942,422, filed Feb. 20, 2014, titled "POWER DETECTOR WITH OVERDRIVE DETECTION," the entire disclosure of which is hereby incorporated by reference herein.

TECHNICAL FIELD

The disclosed technology relates to electronics, and, more particularly, to overdrive protection.

DESCRIPTION OF THE RELATED TECHNOLOGY

Amplifiers, such as radio frequency (RF) power amplifiers (PAs), can be damaged by signal overdrive. An overdrive event can occur when a power of a signal applied to a PA is sufficiently large to cause damage to some or all of the PA. Previous methods of overdrive protection have been inadequate for certain applications and damage to PAs has occurred even in the presence of overdrive protection circuits.

Accordingly, a need exists for improved overdrive protection.

SUMMARY OF CERTAIN INVENTIVE ASPECTS

One aspect of this disclosure is an apparatus that includes an envelope detector, an averaging circuit, a first comparator, and a second comparator. The envelope detector is configured to generate an indication of instantaneous power of a radio frequency (RF) signal. The averaging circuit is configured to generate an indication of an average power of the RF signal. The first comparator is configured to receive a first threshold and the indication of the average power of the RF signal, and to activate an average overdrive signal based at least partly on comparing the first threshold with the indication of the average power of the RF signal. The second comparator is configured to receive a second threshold and the indication of the instantaneous power of the RF signal, and to activate a transient overdrive signal based at least partly on comparing the second threshold with the instantaneous indication of the power of the RF signal.

Another aspect of this disclosure is an electronic system that includes a radio frequency (RF) amplifier, an averaging circuit, a first comparator, and an amplification protection circuit. The RF amplifier is configured to receive an RF input signal at an input terminal and to amplify the RF input signal. The averaging circuit is configured to generate an indication of an average power of the RF input signal. The first comparator is configured to receive a first threshold and the indication of the average power of the RF input signal, and to activate an average overdrive signal based at least partly on comparing the first threshold with the indication of the average power of the RF signal. The amplifier protection circuit is configured to disable the RF amplifier from amplifying the RF input signal in response to a transition in the average overdrive signal.

Yet another aspect of this disclosure is a method of overdrive protection. The method includes amplifying a radio frequency (RF) signal using an amplifier. The method also includes monitoring an indication of average power of the RF signal at an input of the amplifier. The method further includes in response to detecting that the indication of average power of the RF signal satisfies a first threshold, disabling said amplifying the RF signal using the amplifier.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF CERTAIN EMBODIMENTS

Figure 1A:
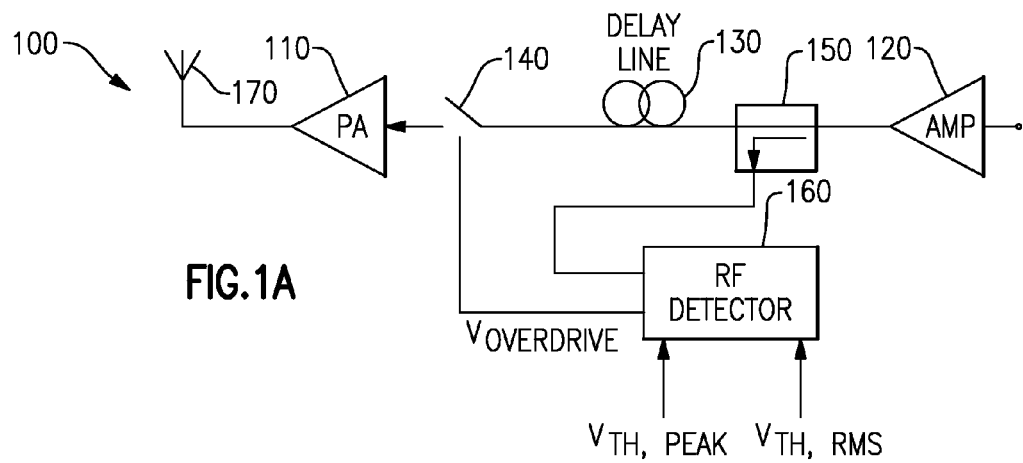
FIG. 1A is a schematic diagram of an electronic system in which an input to a power amplifier (PA) is protected from overdrive events, according to an embodiment.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale.

As discussed above, amplifiers can be damaged by signal overdrive. Detecting and reacting to an overdrive event can advantageously protect an amplifier and/or other circuits. However, some previous efforts have failed to provide adequate overdrive protection for certain applications. Some previous RF power detectors have been unable to detect certain overdrive events, which has resulted in damage to circuitry being protected due to such undetected overdrive events. In some instances, previous efforts have been slower in reacting to overdrive events than desired.

Alternatively or additionally, some existing electronic systems include delay lines for carrying RF signals. For example, such delay lines can carry an RF signal in a path from an antenna to an amplifier, such as an LNA, and/or in a path from an RF amplifier to a PA. A delay line can be a particular type of transmission line that causes a signal to be delayed. For instance, a delay line can be a long wire that causes delay. When a protection circuit has a relatively slow response time, the delay line can be configured to delay the signal so that the protection circuit can detect an overdrive event and react to protect the amplifier before the signal reaches an input of the amplifier. The overdrive detection described herein can occur relatively quickly. For instance, integrating detectors, comparators, and digital logic on a single chip can result in relatively fast overdrive detection. With relatively fast overdrive detection, the delay of the delay line can be reduced relative to previous solutions or the delay line can even be eliminated in some instances. For example, an instantaneous overdrive detection path through an envelope detector can have a relatively fast response time (for example, about 5 to 10 nanoseconds). With such a response time associated with detecting an overvoltage event, the delay line can be eliminated and a transmission line without added delay can be implemented. Reducing the delay of the delay line or eliminating the delay line can result in a significant decrease in cost, complexity, and/or physical circuit size.

RF amplifiers, such as power amplifiers (PAs) or low-noise amplifiers (LNAs), can amplify signals in the RF frequency range. These RF amplifiers can generate RF signals at power levels ranging from on the order of milliwatts to on the order of hundreds of Watts in some applications. If an input signal to the RF amplifier has a sufficiently high power, the RF amplifier can be damaged. Multiple types of overdrive events can damage the RF amplifier. An average overdrive event can occur when an average magnitude of a power of an input signal to an amplifier exceeds a first threshold for a period of time. Average overdrive events can alternatively be referred to as continuous overdrive events. A transient overdrive event can occur when a magnitude of a power of an input signal to an amplifier exceeds a second threshold. A transient overdrive event or an average overdrive event can damage, or even destroy, an amplifier and/or other circuits.

Aspects of this disclosure relate to an RF power detector with multi-mode overdrive protection for an amplifier, such as an RF amplifier. An RF power detector can detect transient overdrive events and can also detect continuous overdrive events. An amplifier can be protected from either a transient overdrive event or a continuous overdrive event using such an RF power detector. The RF power detector can generate an indication of peak RF power and an indication of average RF power. In certain embodiments, the RF power detector can include an envelope detector configured to compute the instantaneous envelope of the RF signal and an averaging circuit configured to compute a root mean square (RMS) level of the power of the RF signal based on an output of the envelope detector. The RF power detector can also include a first comparator configured to compare a first threshold with the indication of average RF power and a second comparator configured to compare a second threshold with the indication of peak RF power. In some embodiments, the RF power detector can be implemented on a monolithic integrated circuit. This can provide improvements in speed of detecting overdrive events, cost, and/or area compared to implementations with multiple integrated circuits and/or discrete circuit elements for detecting overdrive events. The monolithic integrated circuit can include both analog and digital circuitry. For instance, analog signal processing circuitry can detect RF power levels, and digital logic circuitry can implement an alarm circuit. Accordingly, digital functionality can be implemented in an RF power detector. Moreover, integrating analog and digital circuits on a single integrated circuit can reduces size, cost, response time, or any combination thereof compared to using an integrated circuit for analog circuits and using a separate integrated circuit for digital circuits.

FIG. 1A is a schematic diagram of an electronic system 100 in which an input to a power amplifier (PA) 110 is protected from overdrive events, according to an embodiment. The electronic system 100 and/or any of the electronic systems described herein can be implemented in a base station configured to facilitate wireless communications, for example. The electronic system 100 illustrated in FIG. 1A and/or any of the other illustrated electronic systems can include more or fewer elements than illustrated. The electronic system 100 illustrated in FIG. 1A includes an amplifier 120 configured to provide an RF signal to an input of the PA 110 via a transmission line, such as a delay line 130, and a switch 140. As illustrated, the output of the amplifier 120 can provide the RF signal to the directional coupler 150. The output of the directional coupler 150 can be coupled to the delay line 130, which can add a propagation delay between the directional coupler 150 and the switch 140. The RF signal can be an alternating current (AC) signal. The switch 140 can be an analog switch and/or an RF switch. The switch 140 can function similar to a relay without having moving parts. The switch 140 can conduct analog signals when on and electrically isolate switched terminals when off. Accordingly, the switch 140 can function as an amplifier protection circuit. In one embodiment, the switch 140 is a single pole single throw switch. FIG. 1A further illustrates that a directional coupler 150 can provide a portion of the RF signal to an RF power detector 160. The RF power detector 160 can control the switch 140 such that the switch 140 electrically isolates the input of the PA 110 from the RF signal generated by the amplifier 120 in response to an overdrive event being detected. For instance, the switch 140 can electrically isolate the input of the PA 110 from the RF signal generated by the amplifier 120 in response to a transition in an overdrive signal $V_{OVERDRIVE}$ generated by the RF power detector 160. The overdrive signal $V_{OVERDRIVE}$ is a voltage signal in the embodiment of FIG. 1A. The PA 110 can provide an amplified version of the RF signal to an antenna 170.

In the electronic system 100, the RF power detector 160 is configured to detect the power of an RF signal provided to an input of the PA 110. The RF power detector 160 can generate an indication of peak power of the RF signal from the portion of the RF signal provided by the directional coupler 150. The RF power detector 160 can also generate an indication of average power of the RF signal from the portion of the RF signal provided by the directional coupler 150. The RF power detector 160 can receive a first threshold $V_{TH,RMS}$ and a second threshold $V_{TH,PEAK}$. These thresholds can be voltage signals, as illustrated. The thresholds can be set at the direction of a controller in some embodiments. For example, the controller can set or adjust the thresholds by setting the inputs to one or more digital-to-analog converters, which in turn provide at least one of the first threshold $V_{TH,RMS}$ or a second threshold $V_{TH,PEAK}$. The controller can alternatively select a reference voltage from among a plurality of reference voltages, or the like. The controller can be directed by a user.

The RF power detector 160 can monitor the indication of the average power of the RF signal being provided to the input of the PA 110. The RF power detector 160 can compare the first threshold $V_{TH,RMS}$ with the indication of average power of the RF signal. When a magnitude of the indication of average power of the RF signal is greater than the first threshold, the RF power detector 160 can indicate an average overdrive event. In response to detecting the average overdrive event, the RF power detector 160 can assert an overdrive signal $V_{OVERDRIVE}$ to open the switch 140 and electrically isolate the RF signal from the input of the PA 110. This can prevent the PA 110 from being damaged by an average overdrive event.

While the RF power detector 160 monitors the indication of the average power of the RF signal, the RF power detector 160 can concurrently monitor the indication of the peak power of the RF signal being provided to the input of the PA 110. The RF power detector 160 can compare the second threshold $V_{TH,PEAK}$ with the indication of peak power of the RF signal. When a magnitude of the indication of peak power of the RF signal is greater than the second threshold, the RF power detector 160 can indicate a transient overdrive event. In response to detecting the transient overdrive event, the RF power detector 160 can assert the overdrive signal $V_{OVERDRIVE}$ to open the switch 140 and electrically isolate the RF signal from the input of the PA 110. This can prevent the PA 110 from being damaged by a transient overdrive event.

Accordingly, the RF power detector 160 can monitor input power to the PA 110 and react to protect the PA 110 from different types of potentially damaging overdrive events. While average and transient overdrive events are described herein for illustrative purposes, the principles and advantages discussed herein can be applied to protecting from other types of overdrive events. For instance, the principles and advantages discussed herein can be applied to apparatus, systems, and methods of providing overdrive protection from two or more different types of overdrive events.

Figure 1B:
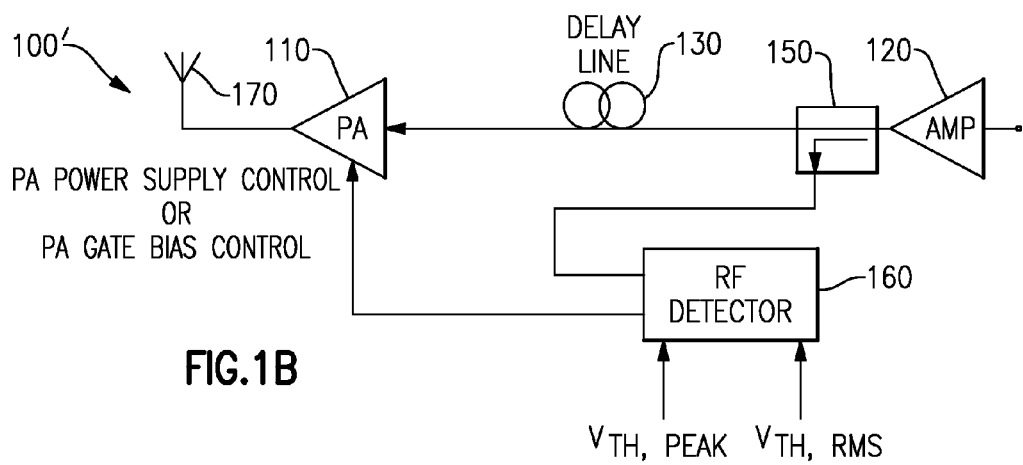
FIG. 1B is a schematic diagram of an electronic system in which a power amplifier (PA) is protected from overdrive events, according to an embodiment.

FIG. 1B is a schematic diagram of an electronic system 100' in which a PA 110 is protected from overdrive events, according to an embodiment. Like the electronic system 100, the electronic system 100' can provide overdrive protection by disabling the PA 110 from amplifying the RF signal. The electronic system 100' can be substantially the same as the electronic system 100 except that these electronic systems provide overdrive protection by disabling the PA 110 in different ways. The electronic system 100' can provide overdrive protection by decoupling the PA 110 from a power supply and/or by adjusting a bias to the PA 110 such that the PA 100 is disabled from amplifying the RF signal. For instance, the overdrive signal can be provided to an amplification protection circuit of the PA 110 to adjust the gate bias of the PA 110 so as to disable the PA 110 from amplifying the RF signal. In one embodiment, an alarm circuit of the RF detector 160 can control a first switch and a second switch. The first switch can be controlled to disconnect and/or control a gate bias voltage of the PA 110. The second switch can be controlled to provide a ground potential as the PA gate bias voltage to disable the PA 100 from amplifying the RF signal. Configuring the gate bias of the PA 110 to prevent the PA 110 from amplifying the RF signal can prevent damage from overdrive events even when the RF signal is provided to the input of the PA 100. As another example, the overdrive signal can be provided to an amplification protection circuit of the PA 110 to disconnect a power supply so as to prevent the PA 110 from amplifying the RF signal.

Figure 2:
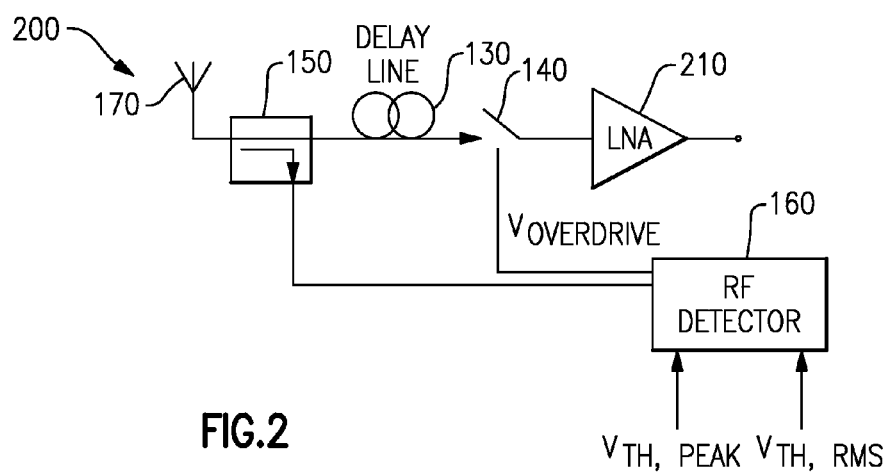
FIG. 2 is a schematic diagram of an electronic system in which an input to a low-noise amplifier (LNA) in a receiver is protected from overdrive events, according to an embodiment.

FIG. 2 is a schematic diagram of an electronic system 200 in which an input to a low-noise amplifier (LNA) 210 in a receiver is protected from overdrive events, according to an embodiment. In the electronic system 200, the LNA 210 can be disabled from amplifying an RF signal. For instance, any of the principles and advantages of protecting the input of the PA 110 described in connection with FIG. 1A can be applied to protecting an input to the LNA 210 from overdrive events. For instance, the switch 140, the RF power detector 160, and/or the antenna 170 of FIG. 2 can be functionally similar or identical to the switch 140, the RF power detector 160, and/or the antenna 170 of FIG. 1A. According to some other embodiments (not illustrated), the supply voltage can be decoupled from the LNA 210 and/or the LNA 210 can be biased such that the LNA 210 does not amplify a received RF signal.

The electronic system 200 illustrated in FIG. 2 includes an antenna 170 configured to receive an RF signal and provide the RF signal to an input of the LNA 210 via a switch 140. As shown in FIG. 2, the RF signal can propagate from the antenna 170 through the directional coupler 150 and then through a transmission line, such as the delay line 130, to the switch 140. FIG. 2 illustrates that a directional coupler 150 can provide a portion of the RF signal to an RF power detector 160. The RF power detector 160 can control the switch 140 such that the switch 140 electrically isolates the input of the LNA 210 from the RF signal received by the antenna 170 in response to an overdrive event being detected. In the illustrated embodiment, the switch 140 isolates the input by generating an open circuit. In an alternative embodiment, the switch 140 isolates the input by generating a short circuit to ground. Accordingly, the RF power detector 160 can monitor input power to the LNA 210 and react to protect the LNA 210 from transient overdrive events and average overdrive events.

Figure 3:
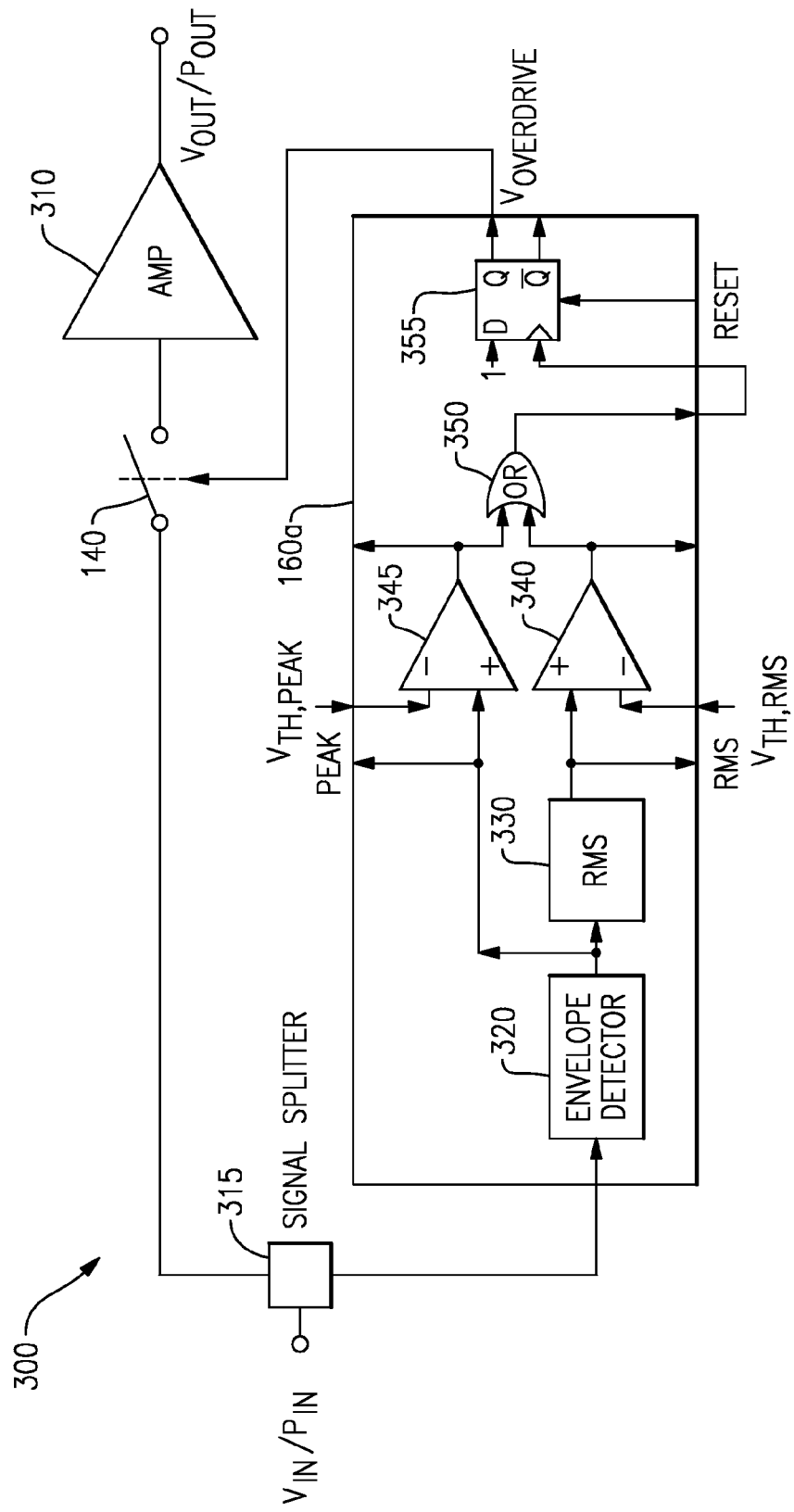
FIG. 3 is a schematic diagram of an electronic system with an RF power detector configured to protect an amplifier from both transitory and continuous overdrive events, according to an embodiment.

FIG. 3 is a schematic diagram of an electronic system 300 with an RF power detector 160a configured to protect an amplifier 310 from both transitory and continuous overdrive events, according to an embodiment. The RF power detector 160a is an example of the RF power detector 160 of FIG. 1A, FIG. 1B, and/or FIG. 2. The RF power detector 160a can simultaneously detect average power and instantaneous power of an AC signal. The RF power detector 160a can trigger an alarm circuit when an indication of average power exceeds a first threshold and/or when an indication of peak power exceeds a second threshold. The RF power detector 160a can generate an overdrive signal $V_{OVERDRIVE}$ to protect the amplifier 310 from both transitory overdrive events and average overdrive events. An indication of average power RMS can be provided to an output contact, such as a pin, of the RF power detector 160a. An indication of peak power can also be provided to another output contact, such as a pin, of the RF power detector 160a. The RF power detector 160a can include more or fewer elements than illustrated in FIG. 3.

As illustrated, the system 300 includes a signal splitter 315 that provides a portion of an input signal to the amplifier 310 via the switch 140 and another portion of the input signal to the RF power detector 160b. The signal splitter 315 can receive an RF signal from an amplifier, such as the amplifier 120 of FIG. 1, in some applications. A directional coupler, such as the directional coupler 150 of FIG. 1, can be implemented in place of the signal splitter 315 in any of the embodiments of FIGS. 3, 4, and/or 6 in certain implementations. While the switch 140 is located between the signal splitter 315 and the input to the amplifier 310 in the embodiment of FIG. 3, the signal splitter 315 can be located between the switch 140 and the amplifier 310 in some other embodiments.

The switch 140 can activate or deactivate the amplifier 310 based on an overdrive signal $V_{OVERDRIVE}$ provided by the RF power detector 160. In response to the overdrive signal $V_{OVERDRIVE}$ being asserted, the switch 140 can deactivate the amplifier 310. The overdrive signal $V_{OVERDRIVE}$ and/or any of the other signals described herein can be at a logic 1 level when asserted in some implementations. It will be understood that the opposite convention (i.e., signals being at a logic 0 level when asserted) can alternatively be adopted for one or more of the signals discussed herein. The switch 140 of FIG. 3 can implement any combination of features of the switch 140 of FIG. 1A and/or FIG. 2. Similarly, the switch 140 of FIG. 1A and/or FIG. 2 can implement any combination of the switch 140 of FIG. 3. The switch 140 can be any suitable switch configured to provide an RF input signal to an input of the amplifier 310 when closed and to electrically isolate the input of the amplifier 310 from the RF input signal when open. The switch 140 can be implemented in GaAs technology, SiGe technology or CMOS technology, for example. When the switch 140 is implemented in GaAs technology, SiGe technology or CMOS technology, the switch 140 can advantageously have a relatively low loss. According to some implementations, the switch 140 can be implemented by BiCMOS technology. The switch 140 can change state relatively fast. For example, the RF switch can transition between states in about 5 nanoseconds to about 10 nanoseconds in some embodiments.

The amplifier 310 can be any suitable amplifier. The amplifier 310 can be, for example, the PA 110 of FIG. 1A or the LNA 210 of FIG. 2 in some embodiments. Overdrive protection for the amplifier 310 can be implemented with RF applications and/or applications in which relatively high power signals and/or signals with a relatively wide variation in power are received by the amplifier 310.

The RF power detector 160a can include an envelope detector 320 and an averaging circuit 330. The RF power detector 160a can implement any combination of features described in U.S. Pat. No. 8,072,205, issued Dec. 6, 2011, titled "PEAK-TO-AVERAGE MEASUREMENT WITH ENVELOPE PRE-DETECTION," the entire technical disclosure of which is hereby incorporated by reference in its entirety herein. The envelope detector 320 can receive a portion of the input signal from the signal splitter 315. The envelope detector 320 can generate an envelope signal. For instance, the envelope detector 320 can half-wave or full-wave rectify and low-pass filter the input signal. This can generate a low frequency, all positive envelope signal. The envelope signal can be proportional to the instantaneous magnitude of the input signal. The envelope signal can be indicative of an instantaneous power of the input signal, which can also be referred to as a transient power of the input signal. When the envelope signal reaches a high level, the envelope signal indicates that the instantaneous power of the input signal is reaching a high level.

The averaging circuit 330 can generate an indication of average power of the input signal. The averaging circuit 330 can apply a root mean square (RMS) averaging computation in certain embodiments and other averaging computations in some other embodiments. The averaging circuit 330 can have a time constant that is longer than the time constant of the envelope detector 320. For instance, the time constant of the averaging circuit 330 can be selected from a range from about 1 microsecond to 100 milliseconds in certain implementations. Generating an indication of average power of the input signal can be a two stage process according to the illustrated embodiment. First, the envelope detector 320 can generate the envelope signal. The envelope signal can be provided to the averaging circuit 330. Then the averaging circuit 330 can square the envelope signal, average the squared envelope signal, and generate the square root of the squared envelope signal, which is an indication of average power of the input signal, according to an embodiment. In another implementation, the averaging circuit 330 can include a low-pass filter with a time constant longer than a time constant in the envelope detector 320. According to some other embodiments (not illustrated), the averaging circuit 330 can generate an average power of the input signal in parallel with the envelope detector 320 generating the envelope signal. The averaging circuit 330 can output the indication of average power of the input signal.

The RF power detector 160a can include a first comparator 340 and a second comparator 345. The first comparator 340 and/or the second comparator 345 can be analog circuits. The first comparator 340 and/or the second comparator 345 can be high speed comparators. For instance, the first comparator 340 and/or the second comparator 345 can facilitate the overdrive signal $V_{OVERDRIVE}$ being asserted within about 5 nanoseconds to about 10 nanoseconds of an overdrive event. With such relatively fast assertion of the overdrive signal $V_{OVERDRIVE}$, the delay of the delay line 130 of FIG. 1A, FIG. 1B, and/or FIG. 2 can be reduced and/or the delay line 130 can be eliminated as illustrated in FIGS. 3 to 6. It will be understood that any of the disclosed embodiments can be implemented without a delay line and/or can include a delay line with a reduced delay relative to previous electronic systems with slower overdrive detection.

The first comparator 340 can generate an average overdrive signal that is asserted when an indication of average power of the input signal exceeds a first threshold $V_{TH,RMS}$. The first comparator 340 can receive the indication of the average power of the input signal from the averaging circuit 330 at a positive input terminal and a first threshold $V_{TH,RMS}$ at a negative input terminal. The first comparator 340 can generate an average overdrive signal based at least partly on comparing the first threshold $V_{TH,RMS}$ with the indication of the average power of the input signal.

The second comparator 345 can generate a transient overdrive signal that is asserted when an indication of transient power of the input signal exceeds a second threshold $V_{TH,PEAK}$. The second comparator 345 can receive the indication of the transient power of the input signal from the envelope detector 320 at a positive input terminal and a second threshold $V_{TH,PEAK}$ at a negative input terminal. The second comparator 345 can generate a transient overdrive signal based at least partly on comparing the second threshold $V_{TH,PEAK}$ with the indication of the transient power of the input signal.

The first threshold $V_{TH,RMS}$ and the second threshold $V_{TH,PEAK}$ can be independently controllable at the direction of a user. The first threshold $V_{TH,RMS}$ and the second threshold $V_{TH,PEAK}$ can be at different levels. The first threshold $V_{TH,RMS}$ and the second threshold $V_{TH,PEAK}$ can have any combination of features of the thresholds described with reference to FIG. 1A.

The RF power detector 160a can include an alarm circuit. The alarm circuit can receive the average overdrive signal and the transient overdrive signal and generate an overdrive signal to control the switch 140. The alarm circuit can include combination logic implemented by digital circuitry and/or one or more state elements, such as a flip-flop. For example, the alarm circuit can include an OR gate 350 and a flip-flop 355, such as a D-type flip-flop. As illustrated in FIG. 3, the output of the first comparator 340 and the output of the second comparator 345 can be provided to the OR gate 350. The output of the OR gate 350 can be asserted when the output of the first comparator 340 is asserted, when the output of the second comparator 345 is asserted, and when the outputs of both the first comparator 340 and the second comparator 345 are asserted. The output of the OR gate 350 can be asserted for a period of time corresponding to the input signal having an average power exceeding the first threshold $V_{TH,RMS}$, a transient power exceeding the second threshold $V_{TH,PEAK}$, or both the average power exceeding the first threshold $V_{TH,RMS}$ and the transient power exceeding the second threshold $V_{TH,PEAK}$. The output of the OR gate 350 can be provided to a clock input of the flip-flop 355 to latch the output of the OR gate 350. Accordingly, when the output of the OR gate 350 is asserted (even if for a relatively short period of time), the flip-flop 355 can latch the output of the OR gate 350 and assert the overdrive signal. While the output of the OR gate 350 is illustrated as being routed off chip, the output of the OR gate 350 can be routed on chip to the flip-flop 355 and/or buffered. In alternative embodiments, a set-reset latch or other form of latch can be used to latch the overdrive event. The overdrive signal can be used as an alarm. The overdrive signal can cause the switch 140 to electrically isolate the input signal from the input of the amplifier 310 in response to an average overdrive event and/or a transient overdrive event being detected. For instance, the overdrive signal can cause the switch 140 to electrically isolate the input signal from the input of the amplifier 310 in response to a transition in the average overdrive signal and/or the transient overdrive signal. In this example, a transition in the overdrive signal can cause the switch 140 to electrically isolate the input signal from the input of the amplifier 310.

The output of the flip-flop 355 can be used as an alarm mechanism. Under normal operating conditions, the switch 140 is closed and the input signal is provided to the input of the amplifier 310 via the switch 140. This results in the amplifier 310 amplifying the input signal. If the RF power detector 160a determines that an overdrive event, such as a transient overdrive event and/or an average overdrive event, has occurred, the output of the flip-flop 355 can be asserted (for example, at a logic 1 level). As discussed above, the controller can define when such overdrive events occur by providing thresholds to the RF power detector 160a. Transitioning the output of the flip-flop 355 to be asserted can cause the switch 140 to open so that the input of the amplifier 310 is protected from the overdrive event. The switch 140 can remain open until the flip-flop 355 is reset, for example, using the reset signal.

The RF power detector 160a can be implemented on a monolithic integrated circuit. As illustrated in FIG. 3, the envelope detector 320, the averaging circuit 330, the first comparator 340, the second comparator 345, and the alarm circuit can be included on a single integrated circuit. Accordingly, the single integrated circuit can include both analog and digital circuitry. By including the illustrated functionalities of the RF power detector 160a on a single integrated circuit, an overdrive event can be detected and the overdrive signal can be asserted relatively fast, for example, in around 5 nanoseconds to 10 nanoseconds in some embodiments. The integrated circuit can include input contacts, such as pins, for the input signal, the first threshold $V_{TH,RMS}$, the second threshold $V_{TH,PEAK}$, a clock signal of the flip-flop 355, a reset signal of the flip-flop 355, or any combination thereof. Each input signal can be received at a separate input contact in certain applications. According to some other applications, two or more signals can be received at a single input contact. The single integrated circuit can include output contacts, such as pins, for the an average power signal RMS, an envelope signal PEAK, an indication of an average overdrive event, an indication of a peak overdrive event, an indication of either an average overdrive event or a peak overdrive event, an overdrive signal, an inverse overdrive signal, or any combination thereof. Each output signal can be provided to a separate output contact in certain applications. According to some other applications, two or more signals can be provided to at a single output contact. One or more contacts of the integrated circuit can serve as input/output contacts that can receive an input signal and provide an output signal.

Figure 4:
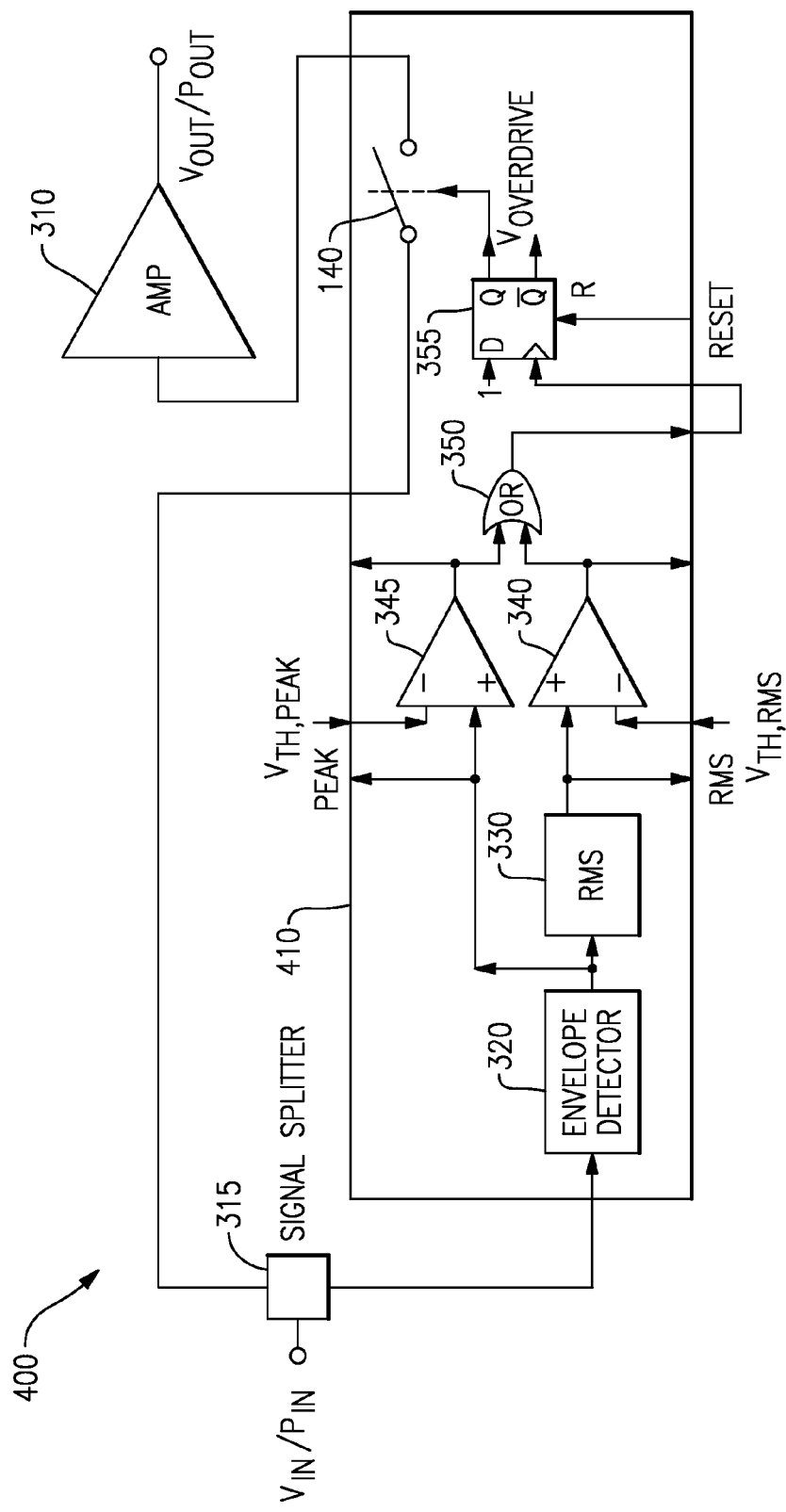
FIG. 4 is a schematic diagram of an electronic system with an RF power detector configured to protect an amplifier from both transitory and continuous overdrive events in which the RF power detector and an RF switch are implemented on a monolithic integrated circuit, according to an embodiment.
Figure 5:
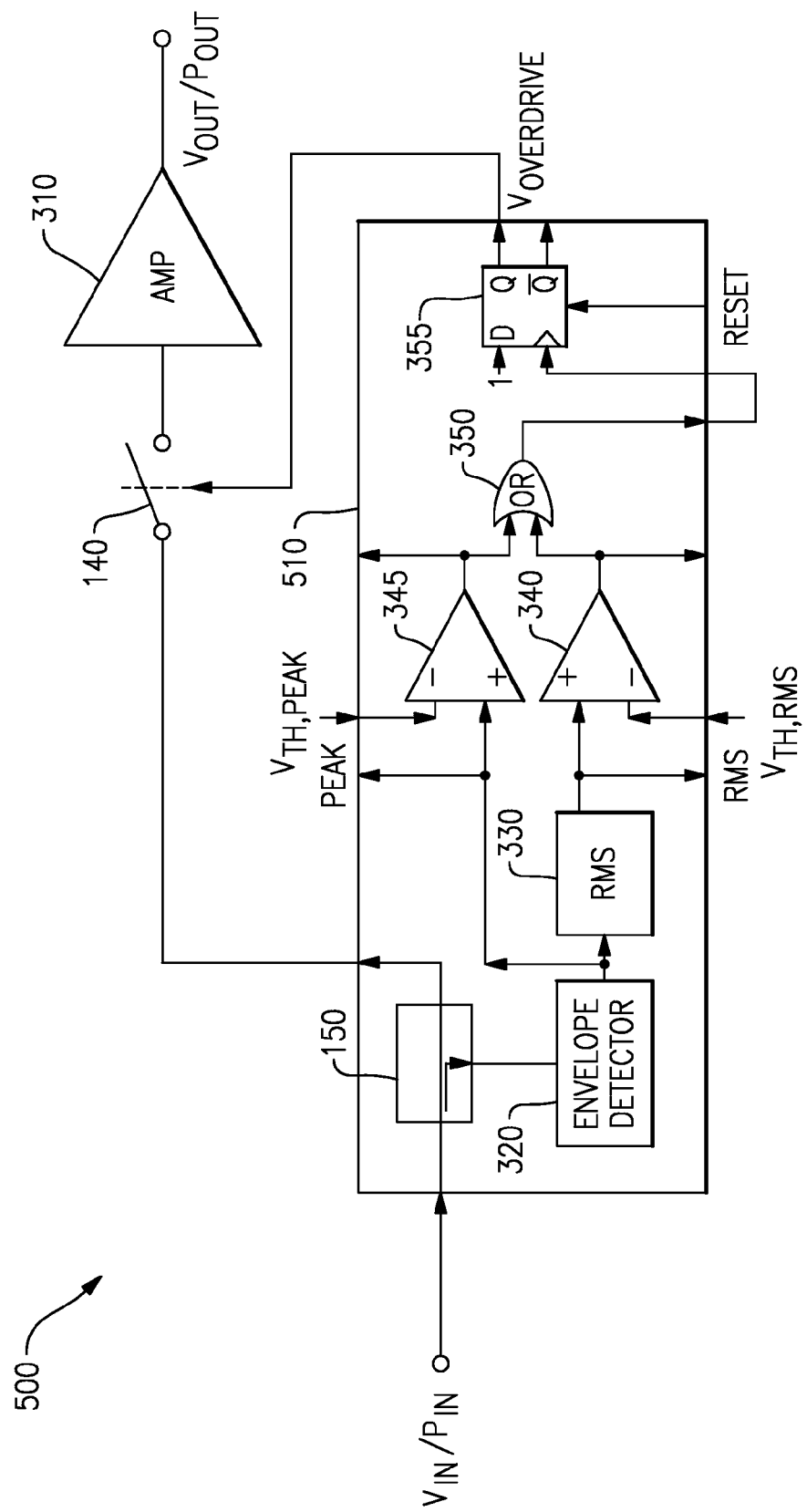
FIG. 5 is a schematic diagram of an electronic system with an RF power detector configured to protect an amplifier from both transitory and continuous overdrive events in which the RF power detector and a directional coupler are implemented on a monolithic integrated circuit, according to an embodiment.
Figure 6:
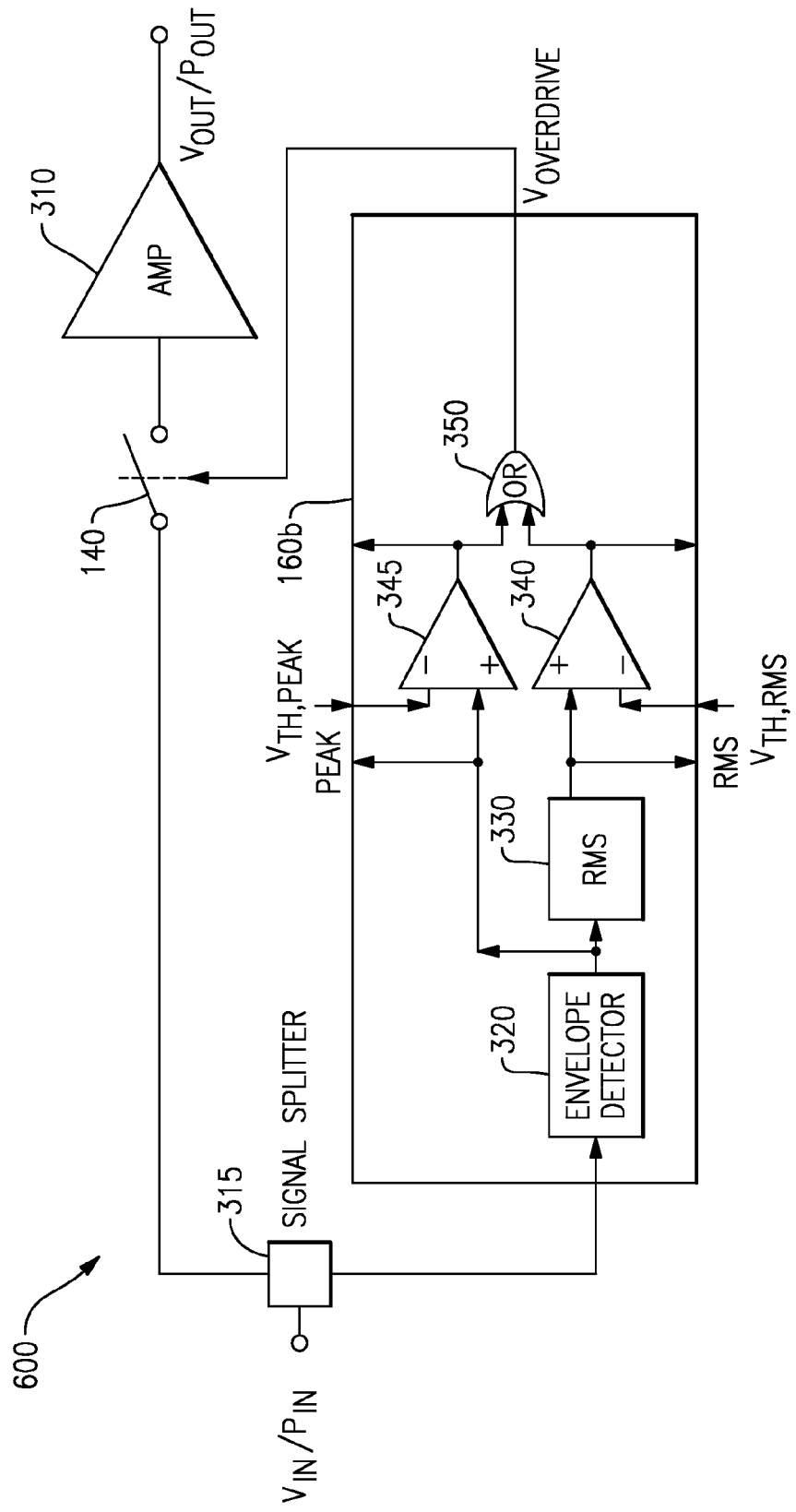
FIG. 6 is a schematic diagram of an electronic system with an RF power detector configured to protect an amplifier from both transitory and continuous overdrive events for a duration of an overdrive event, according to another embodiment.

FIGS. 4 to 6 illustrate modified versions of electronic system 300 of FIG. 3. Like symbols indicate functionally similar or identical elements. The electronic systems shown in FIGS. 4 to 6 can implement any suitable combination of features of the systems illustrated in FIG. 1A to 3. Any combination of features shown and/or discussed with reference to any of FIGS. 4 to 6 can be implemented in connection with any of the features discussed with reference to any combination of FIGS. 1A to 3.

FIG. 4 is a schematic diagram of an electronic system 400 with an RF power detector configured to protect an amplifier 310 from both transitory and continuous overdrive events in which the RF power detector and a switch 140 are implemented on a monolithic integrated circuit 410, according to an embodiment. In the electronic system 400 illustrated in FIG. 4, the switch 140 and the RF power detector are both implemented on the single monolithic integrated circuit 410. The input signal is provided to an input contact, such as a pin, of the integrated circuit 410. The output of the switch 140 can be provided to the input of the amplifier 310 via an output contact, such as a pin, of the integrated circuit 410. Including the switch 140 on the same integrated circuit as the RF power detector can reduce size of the overall system, reduce costs, reduce response time, or any combination thereof compared to an RF switch that is separate from the integrated circuit that includes the RF power detector. For example, the switch 140 can open faster in response to the overdrive signal when implemented on the same integrated circuit compared to when the switch 140 is implemented separate from the integrated circuit of the RF power detector. The integrated circuit 410 can be implemented in BiCMOS technology is certain embodiments.

FIG. 5 is a schematic diagram of an electronic system 500 with an RF power detector configured to protect an amplifier 310 from both transitory and continuous overdrive events in which the RF power detector and a directional coupler 150 are implemented on a monolithic integrated circuit 510, according to an embodiment. The directional coupler 150 is implemented in place of the signal splitter 315 of FIG. 3 in the electronic system 500 of FIG. 5. The directional coupler 150 can be well suited for RF applications. Directional couplers can result in a lower loss in a signal path than signal splitters. In another embodiment (not illustrated), the signal splitter 315 can be implemented on the integrated circuit 510 instead of the directional coupler 150. The input signal is provided to an input contact, such as a pin, of the integrated circuit 510. The output of the directional coupler 150 can be provided to the input of the switch 140 via an output contact, such as a pin, of the integrated circuit 510. Alternatively, the directional coupler 150 can be located between the switch 140 and the amplifier 310 in some other embodiments, similar to the electronic system 200 shown in FIG. 2.

FIG. 6 is a schematic diagram of an electronic system 600 with an RF power detector 160b configured to protect an amplifier 310 from both transitory and continuous overdrive events for a duration of an overdrive event, according to another embodiment. The RF power detector 160b is an example of the RF power detector 160 of FIGS. 1 and/or 2. The RF power detector 160b is like the RF power detector 160a of FIG. 3, except the OR gate 350 of the RF power detector 160b drives the overdrive signal to instead of the flip-flop 355 of the RF power detector 160a of FIG. 3. The RF power detector 160b can protect the input of the amplifier 310 for a period of time that corresponds to the duration of an overdrive event. The RF power detector 160*b* can cause the switch 140 to close so that normal operation can resume in response to the overdrive event ending. Accordingly, a reset signal is not needed to resume normal operation in the electronic system 600.

The systems, apparatus, and methods of overdrive protection are described above with reference to certain embodiments. A skilled artisan will, however, appreciate that the principles and advantages of the embodiments can be used for any other systems, apparatus, or methods with a need for overdrive protection.

Such systems, apparatus, and/or methods can be implemented in various electronic devices. Examples of the electronic devices can include, but are not limited to, consumer electronic products, parts of the consumer electronic products, electronic test equipment, wireless communications infrastructure, etc. Examples of the electronic devices can also include memory chips, memory modules, circuits of optical networks or other communication networks, and disk driver circuits. The consumer electronic products can include, but are not limited to, measurement instruments, medical devices, wireless devices, a mobile phone (for example, a smart phone), cellular base stations, a telephone, a television, a computer monitor, a computer, a hand-held computer, a tablet computer, a personal digital assistant (PDA), a microwave, a refrigerator, a stereo system, a cassette recorder or player, a DVD player, a CD player, a digital video recorder (DVR), a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic device can include unfinished products.

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to." The words "coupled" or "connected", as generally used herein, refer to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the Detailed Description using the singular or plural number may also include the plural or singular number, respectively. The words "or" in reference to a list of two or more items, is intended to cover all of the following interpretations of the word: any of the items in the list, all of the items in the list, and any combination of the items in the list. All numerical values provided herein are intended to include similar values within a measurement error.

The teachings of the inventions provided herein can be applied to other systems, not necessarily the systems described above. The elements and acts of the various embodiments described above can be combined to provide further embodiments. The act of the methods discussed herein can be performed in any order as appropriate. Moreover, the acts of the methods discussed herein can be performed serially or in parallel, as appropriate.

While certain embodiments of the inventions have been described, these embodiments have been presented by way of example only, and are not intended to limit the scope of the disclosure. Indeed, the novel methods, apparatus, and systems described herein may be embodied in a variety of other forms. Furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure. Accordingly, the scope of the present inventions is defined by reference to the claims.

What is claimed is:

1. An apparatus comprising:
   an envelope detector configured to generate an indication of instantaneous power of a radio frequency (RF) signal;
   an averaging circuit configured to generate an indication of an average power of the RF signal;
   a first comparator configured to receive a first threshold and the indication of the average power of the RF signal, and to activate an average overdrive signal based at least partly on comparing the first threshold with the indication of the average power of the RF signal;
   a second comparator configured to receive a second threshold and the indication of the instantaneous power of the RF signal, and to activate a transient overdrive signal based at least partly on comparing the second threshold with the instantaneous indication of the power of the RF signal; and
   an alarm circuit configured to generate an overdrive protection signal, wherein the alarm circuit is configured to assert the overdrive protection signal in response to the indication of average power of the RF signal satisfying the first threshold, and wherein the alarm circuit is configured to assert the overdrive protection signal in response to the indication of the instantaneous power of the RF signal satisfying the second threshold.

2. The apparatus of claim 1, wherein the envelope detector, the averaging circuit, the first comparator, the second comparator, and the alarm circuit are included on a monolithic integrated circuit.

3. The apparatus of claim 2, wherein the first comparator comprises analog circuitry, the second comparator comprises analog circuitry, and the alarm circuit comprises digital circuitry.

4. The apparatus of claim 1, further comprising:
   an amplifier configured to receive the RF signal at an input and to amplify the RF signal; and
   an amplifier protection circuit configured to disable the amplifier from amplifying the RF signal in response to a transition in at least one of the transient overdrive signal or the average overdrive signal.

5. The apparatus of claim 1, wherein the apparatus comprises an integrated circuit that includes the envelope detector, the averaging circuit, the first comparator, and the second comparator.

6. The apparatus of claim 5, wherein the first threshold and the second threshold are received at one or more input contacts of the integrated circuit.

7. The apparatus of claim 1, wherein the averaging circuit is configured to compute a root mean square of an input of the averaging circuit.

8. The apparatus of claim 7, wherein the input of the averaging circuit is operatively coupled to an output of the envelope detector.

9. An electronic system comprising:
   a radio frequency (RF) amplifier configured to receive an RF input signal at an input terminal and to amplify the RF input signal;
   an averaging circuit configured to generate an indication of an average power of the RF input signal;

a first comparator configured to receive a first threshold and the indication of the average power of the RF input signal, and to activate an average overdrive signal based at least partly on comparing the first threshold with the indication of the average power of the RF signal; and an amplifier protection circuit configured to disable the RF amplifier from amplifying the RF input signal in response to a transition in the average overdrive signal indicating that the indication of average power of the RF signal satisfies the first threshold, wherein the amplifier protection circuit is further configured to disable the RF amplifier from amplifying the RF input signal in response to an indication of a peak power of the RF signal satisfying a second threshold.

10. The electronic system of claim 9, wherein the amplifier protection circuit comprises an analog switch configured to electrically connect the RF input signal to the input terminal of the RF amplifier and to electrically isolate the RF input signal from the input terminal of the RF amplifier in response to a transition in the average overdrive signal.

11. The electronic system of claim 9, wherein the amplifier protection circuit is configured to adjust a bias provided to the RF amplifier so as to disable amplification of the RF input signal by the RF amplifier.

12. The electronic system of claim 9, wherein the amplifier protection circuit is configured to decouple the RF amplifier from a power supply so as to disable amplification of the RF input signal by the RF amplifier.

13. The electronic system of claim 9, further comprising:
an envelope detector configured to generate an indication of a peak power of the RF input signal; and
a second comparator configured to receive the second threshold and the indication of the peak power of the RF input signal, and to generate a peak overdrive signal based at least partly on a comparison between the second threshold and the indication of the peak power of the RF signal.

14. The electronic system of claim 9, wherein the electronic system further comprises an alarm circuit configured to generate an overdrive protection signal and to provide the overdrive protection signal to the amplifier protection circuit.

15. The electronic system of claim 9, wherein the RF amplifier comprises a power amplifier or a low-noise amplifier.

16. A method of overdrive protection, the method comprising:
amplifying a radio frequency (RF) signal using an amplifier, wherein the amplifier is configured to receive the RF signal at an input;
monitoring an indication of average power of the RF signal at the input of the amplifier;
asserting an overdrive protection signal using an alarm circuit in response to detecting an average overdrive event, wherein the alarm circuit is configured to assert the overdrive protection signal in response to the indication of average power of the RF signal at the input of the amplifier satisfying a first threshold; and
in response to the overdrive protection signal being asserted by the alarm circuit, disabling the amplifier from amplifying the RF signal to thereby provide overdrive protection from the average overdrive event.

17. The method of claim 16, further comprising:
while amplifying, monitoring an indication of transient power of the RF signal at the input of the amplifier; and
in response to detecting that the indication of peak power of the RF signal satisfies a second threshold, disabling said amplifying the RF signal using the amplifier.

18. The method of claim 17, further comprising generating the indication of the average overdrive event based on the indication of transient power of the RF signal.

19. The method of claim 16, wherein disabling is performed by electrically isolating the RF signal from the input of the amplifier in response to a transition in the overdrive protection signal generated by the alarm circuit.

20. The method of claim 16, wherein disabling is performed by adjusting a bias provided to the amplifier in response to a transition in the overdrive protection signal generated by the alarm circuit.

* * * * *